United States Patent
Liang et al.

(10) Patent No.: US 9,210,825 B2
(45) Date of Patent: Dec. 8, 2015

(54) FIXING MECHANISM FOR FIXING AN ACCESSORY ON A PORTABLE ELECTRONIC DEVICE

(71) Applicant: Wistron Corporation, New Taipei (TW)

(72) Inventors: Chen-Yi Liang, New Taipei (TW); Chun-Chien Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 635 days.

(21) Appl. No.: 13/686,888

(22) Filed: Nov. 27, 2012

(65) Prior Publication Data

US 2013/0223925 A1  Aug. 29, 2013

(30) Foreign Application Priority Data

Feb. 24, 2012  (TW) .............................. 101106207 A

(51) Int. Cl.
  *H05K 7/14* (2006.01)
  *G06F 1/16* (2006.01)

(52) U.S. Cl.
  CPC ............ *H05K 7/1417* (2013.01); *G06F 1/1626* (2013.01); *G06F 1/1656* (2013.01); *G06F 1/1681* (2013.01); *Y10T 403/602* (2015.01); *Y10T 403/70* (2015.01)

(58) Field of Classification Search
  CPC ..... H05K 5/02; H05K 5/0221; H05K 5/0226; H05K 5/0204; G06F 1/16; G06F 1/1613; G06F 1/1615; G06F 1/1616; Y10T 403/7015; Y10T 403/58; Y10T 403/581; Y10T 403/583; Y10T 403/599; Y10T 403/591; Y10T 403/595; Y10T 403/60; Y10T 403/604; Y10T 403/602
  USPC .......................... 292/137, 138, 145, 152, 153
  See application file for complete search history.

(56) References Cited

U.S. PATENT DOCUMENTS

| | | | | |
|---|---|---|---|---|
| 5,782,507 | A * | 7/1998 | Hardee | E05C 1/004 292/145 |
| 7,782,606 | B2 * | 8/2010 | Baker | G06F 1/187 312/223.1 |
| 2005/0035603 | A1 * | 2/2005 | Chen | E05C 1/12 292/116 |
| 2012/0250230 | A1 * | 10/2012 | Lin | E05B 65/0067 361/679.01 |
| 2013/0305489 | A1 * | 11/2013 | Liang | G06F 1/1681 16/277 |

* cited by examiner

*Primary Examiner* — Daniel Wiley
(74) *Attorney, Agent, or Firm* — Winston Hsu; Scott Margo

(57) ABSTRACT

A fixing mechanism includes a base, a movable hook and a sliding key. A first end of the movable hook is for fixing an accessory. The sliding key is slidably installed on the base. The sliding key includes a key body whereon a sliding slot is formed, and a driving part for pushing a second end of the movable hook when the key body moves in a first direction so as to separate the first end of the movable hook from the accessory. The fixing mechanism further includes a rotary arm. A first end of the rotary arm is rotatably installed on the base, and a second end of the rotary arm is slidably installed inside the sliding slot. The second end of the rotary arm stops the second end of the movable hook in a closed position for preventing the movable hook from moving in the first direction.

18 Claims, 8 Drawing Sheets

FIXING MECHANISM FOR FIXING AN ACCESSORY ON A PORTABLE ELECTRONIC DEVICE

BACKGROUND OF THE INVENTION

1. Field of the Invention

The present invention relates to a fixing mechanism, and more particularly, to a fixing mechanism for fixing an accessory on a portable electronic device.

2. Description of the Prior Art

With growth of requirement of a consumer electronic product, it has been one of the main considerations for the modern consumer electronic product to be coupled to an accessory. For example, a tablet computer with thin, light and short designs and capable of being coupled to a variety of accessories has been a trend in the market. The tablet computer with the aforesaid designs has possessed portability and ability to expand functions. However, the conventional design for the tablet computer to be coupled to the accessory is to adopt a mechanism with an assembly direction perpendicular to a locking/unlocking direction of a key. A user is easily to touch other external components as operating the key, so as to result in bad feeling of operation. Furthermore, the accessory is easily to be detached from the tablet computer. As a result, a fixing mechanism with easy assembly, low cost and better structural strength has been an issue of mechanical design for the consumer electronic product.

SUMMARY OF THE INVENTION

The present invention provides a fixing mechanism for fixing an accessory on a portable electronic device for solving above drawbacks.

According to the claimed invention, a fixing mechanism for fixing an accessory on a portable electronic device includes a base, a movable hook and a sliding key. An opening is formed on the base. The movable hook is disposed through the opening in a slidable manner, and a first end of the movable hook is for fixing the accessory. The sliding key slidably is installed on the base and includes a key body and a driving part. A sliding slot is formed on the key body. The driving part is disposed on the key body for pushing a second end of the movable hook when the key body moves in a first direction, so as to separate the first end of the movable hook from the accessory. The fixing mechanism further includes a rotary arm with a first end rotatably installed on the base and a second end slidably installed inside the sliding slot on the key body. The second end of the rotary arm stops the second end of the movable hook in a closed position for preventing the movable hook from moving in the first direction. The second end of the rotary arm slides along the sliding slot as the key body moves in the first direction for separating from the second end of the movable hook, such that the driving part pushes the second end of the movable hook to move in the first direction.

According to the claimed invention, a hole is formed on the second end of the movable hook, and the fixing mechanism further includes a constraining part disposed on the base and installed inside the opening, so as to guide the movable hook to move in the first direction.

According to the claimed invention, at least one first constraining structure is formed on a side of the key body. The fixing mechanism further includes a constraining strip disposed on the base. A plurality of second constraining structures is formed on the constraining strip. The at least one first constraining structure is selectively fixed inside one of the plurality of second constraining structures when the key body moves in the first direction.

According to the claimed invention, the first constraining structure and the second constraining structure are respectively an arc protrusion and an arc concave.

According to the claimed invention, the fixing mechanism further includes a recovery part disposed on the key body for driving the second end of the movable hook to move in a direction opposite to the first direction.

According to the claimed invention, the driving part and the recovery part are disposed on two opposite sides relative to the second end of the movable hook, and the recovery part is for pushing the second end of the movable hook to move in the direction opposite to the first direction.

According to the claimed invention, the driving part and the recovery part are respectively a protruding structure.

According to the claimed invention, the driving part and the recovery part are disposed on the same side relative to the second end of the movable hook, and the recovery part is for pulling the second end of the movable hook to move in the direction opposite to the first direction.

According to the claimed invention, the recovery part is a spring.

According to the claimed invention, the second end of the rotary arm slides along the sliding slot to the closed position when the recovery part drives the second end of the movable hook to move in the direction opposite to the first direction to a position where the second end of the movable hook stops the driving part.

According to the claimed invention, a protruding post is disposed on the second end of the rotary arm and installed inside the sliding slot.

According to the claimed invention, a guiding structure is formed on the second end of the rotary arm for guiding the second end of the rotary arm to separate from the second end of the movable hook when the rotary arm is rotated.

According to the claimed invention, the sliding slot includes a first section and a second section. An angle is included between the first section and the second section. The second end of the rotary arm slides from the first section to the second section when the key body moves in the first direction.

According to the claimed invention, an orientation of the first section is not parallel to the first direction, and an orientation of the second section is substantially parallel to the first direction.

According to the claimed invention, the fixing mechanism further includes at least one engaging part disposed on the base for engaging the key body on the base.

According to the claimed invention, the fixing mechanism further includes at least one stopping part disposed on the base and located on at least one side of the sliding key for constraining sliding movement of the sliding key.

According to the claimed invention, a round hole is formed on the first end of the rotary arm, and the fixing mechanism further includes a screwing component disposed through the round hole for screwing the first end of the rotary arm on the base.

According to the claimed invention, two inclined structures are respectively formed on the base and the movable hook for wedging each other and covering the opening on the base.

The fixing mechanism of the present invention utilizes the mechanical design that a direction of fixing the accessory is identical to a direction of sliding the sliding key for not only providing a user with a good sense of operation, but also for preventing the accessory from easily separating from the portable electronic device. Furthermore, the fixing mechanism of the present invention has advantages of simple structure, fewer structural components and less-occupied mechanical space. Accordingly, the present invention provides the fixing mechanism for fixing the accessory with easy assembly, low cost and good structural strength.

These and other objectives of the present invention will no doubt become obvious to those of ordinary skill in the art after reading the following detailed description of the embodiment that is illustrated in the various figures and drawings.

DETAILED DESCRIPTION

Figure 1:
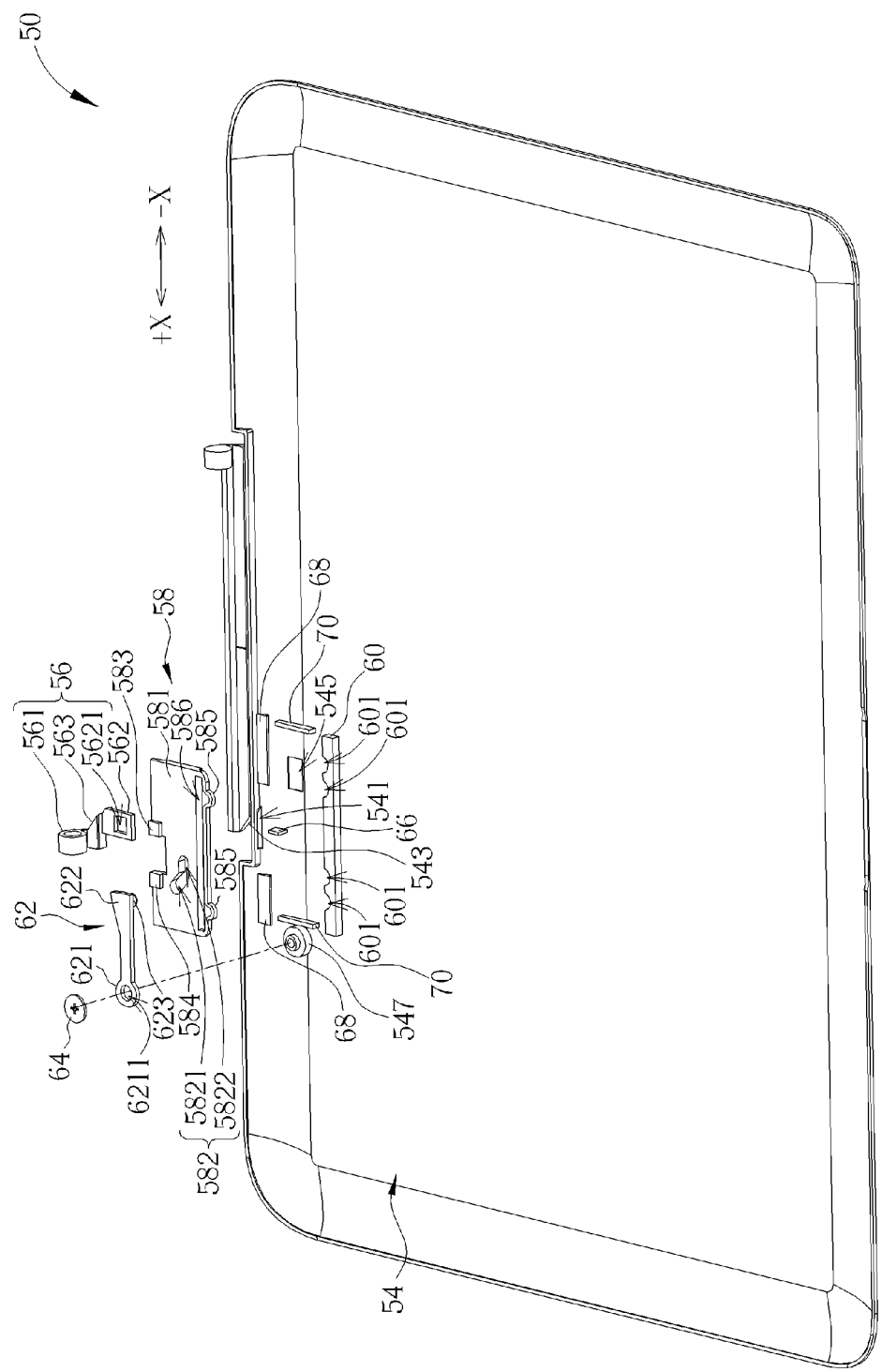
FIG. 1 and FIG. 2 are respectively an exploded diagram and an assembly diagram of a fixing mechanism according to an embodiment of the present invention.
Figure 2:
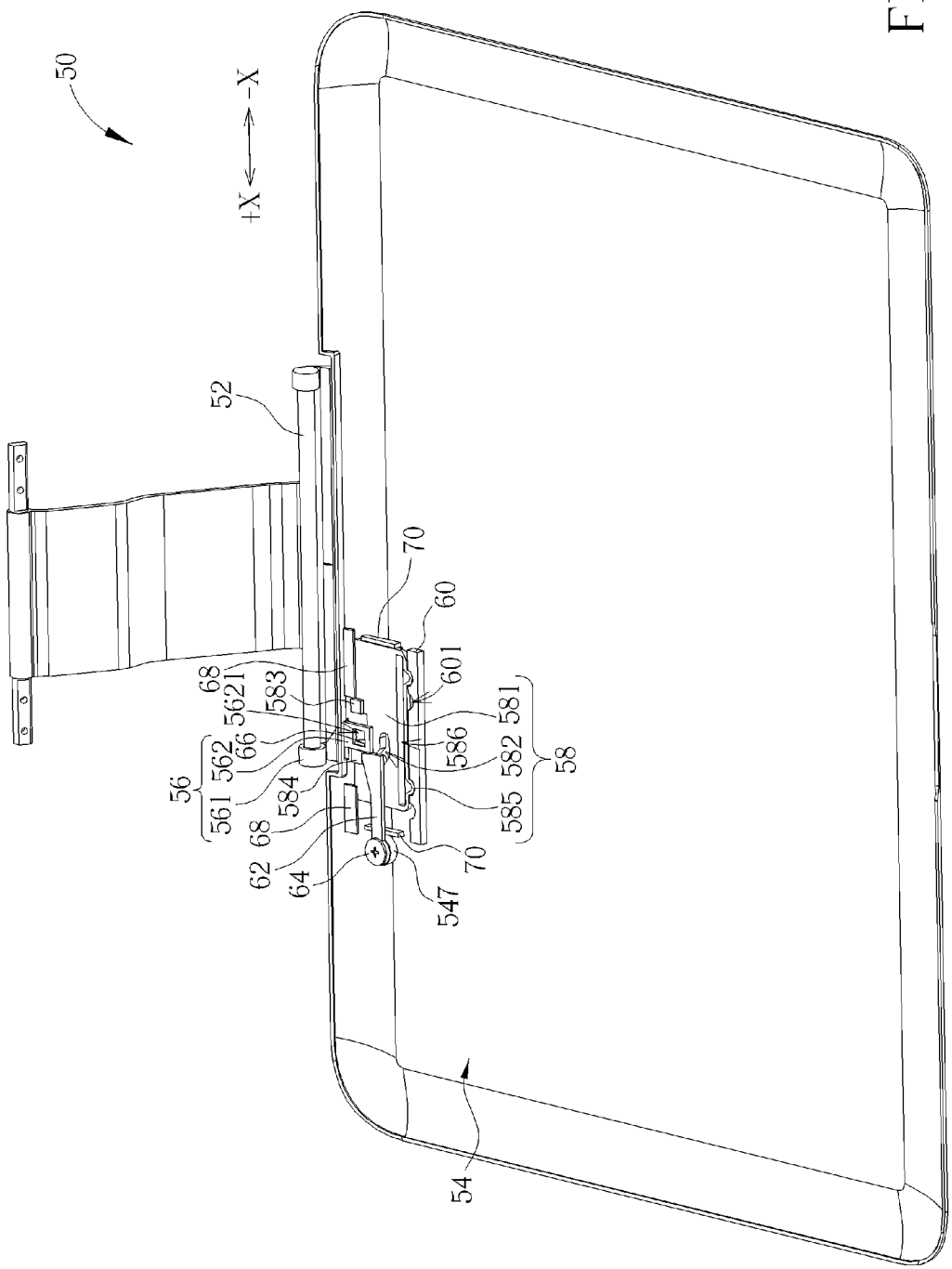
Figure 3:
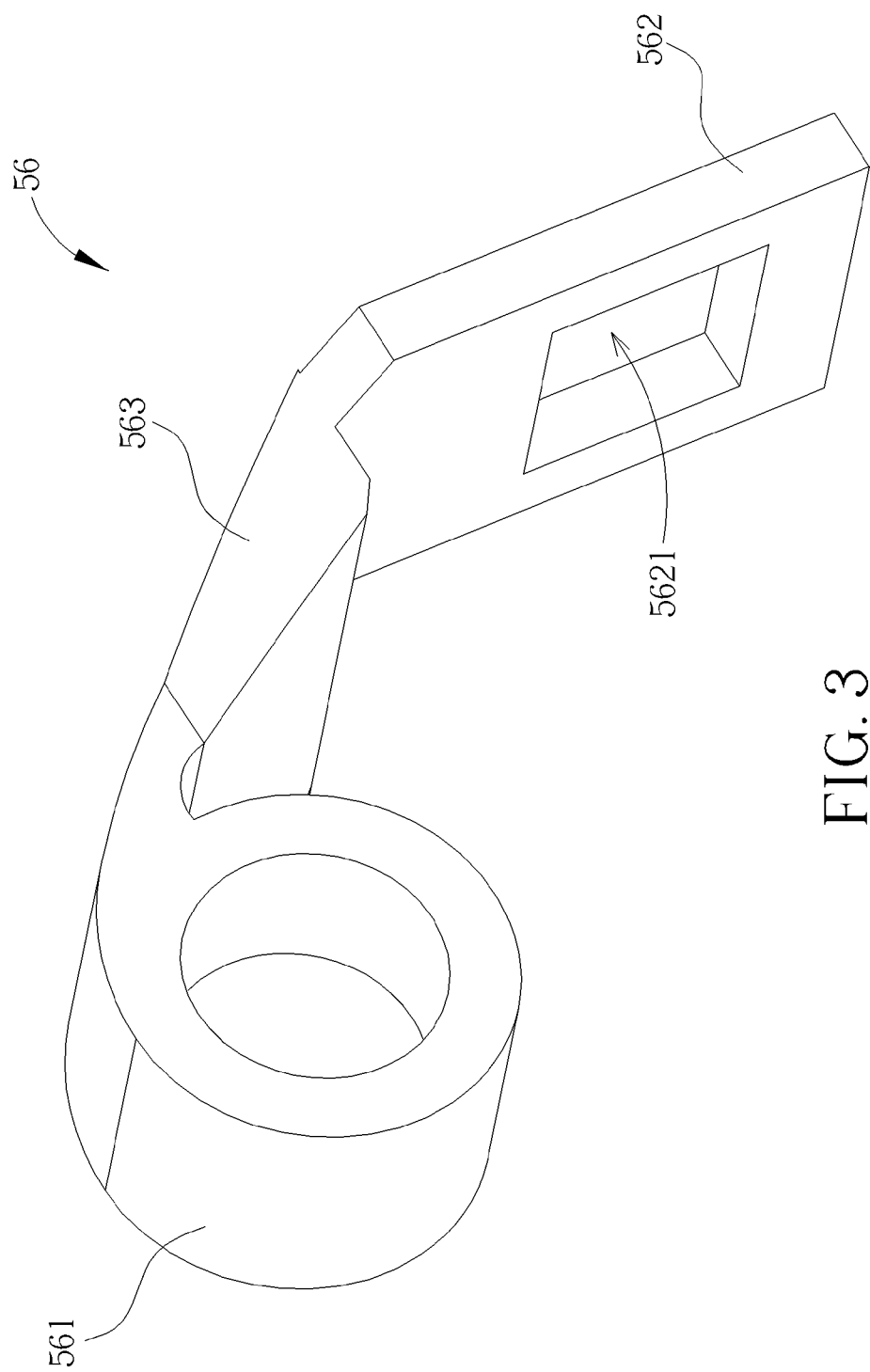
FIG. 3 is a diagram of a movable hook according to the embodiment of the present invention.

Please refer to FIG. 1 and FIG. 2. FIG. 1 and FIG. 2 are respectively an exploded diagram and an assembly diagram of a fixing mechanism 50 according to an embodiment of the present invention. The fixing mechanism 50 is used for fixing an accessory 52 on a portable electronic device, such as for fixing an external hard disk drive on a tablet computer and so on. The fixing mechanism 50 includes a base 54 whereon an opening 541 and an inclined structure 543 are formed. The base 54 can be an external casing of the portable electronic device. The fixing mechanism 50 further includes a movable hook 56 disposed through the opening 541 on the base 54 in a slidable manner. Please refer to FIG. 1 to FIG. 3. FIG. 3 is a diagram of the movable hook 56 according to the embodiment of the present invention. A first end 561 of the movable hook 56 is used for fixing the accessory 52. For example, the first end 561 of the movable hook 56 can be a hook for hooking an end of the accessory 52. A second end 562 of the movable hook 56 is disposed through the opening 541 on the base 54 and disposed on a side of the base 54. A hole 5621 is formed on the second end 562 of the movable hook 56. For example, the hole 5621 can be a rectangular hole. An inclined structure 563 is further formed on a lateral side of the movable hook 56 for wedging with the inclined structure 543 on the base 54. The inclined structure 563 covers the opening 541 on the base 54 cooperatively with the inclined structure 543, so as to prevent internal components from been seen via the opening 541. Accordingly, it can maintain aesthetic feeling of the appearance of the portable electronic device and reduce vibration, so as to enhance stability of operation.

Figure 4:
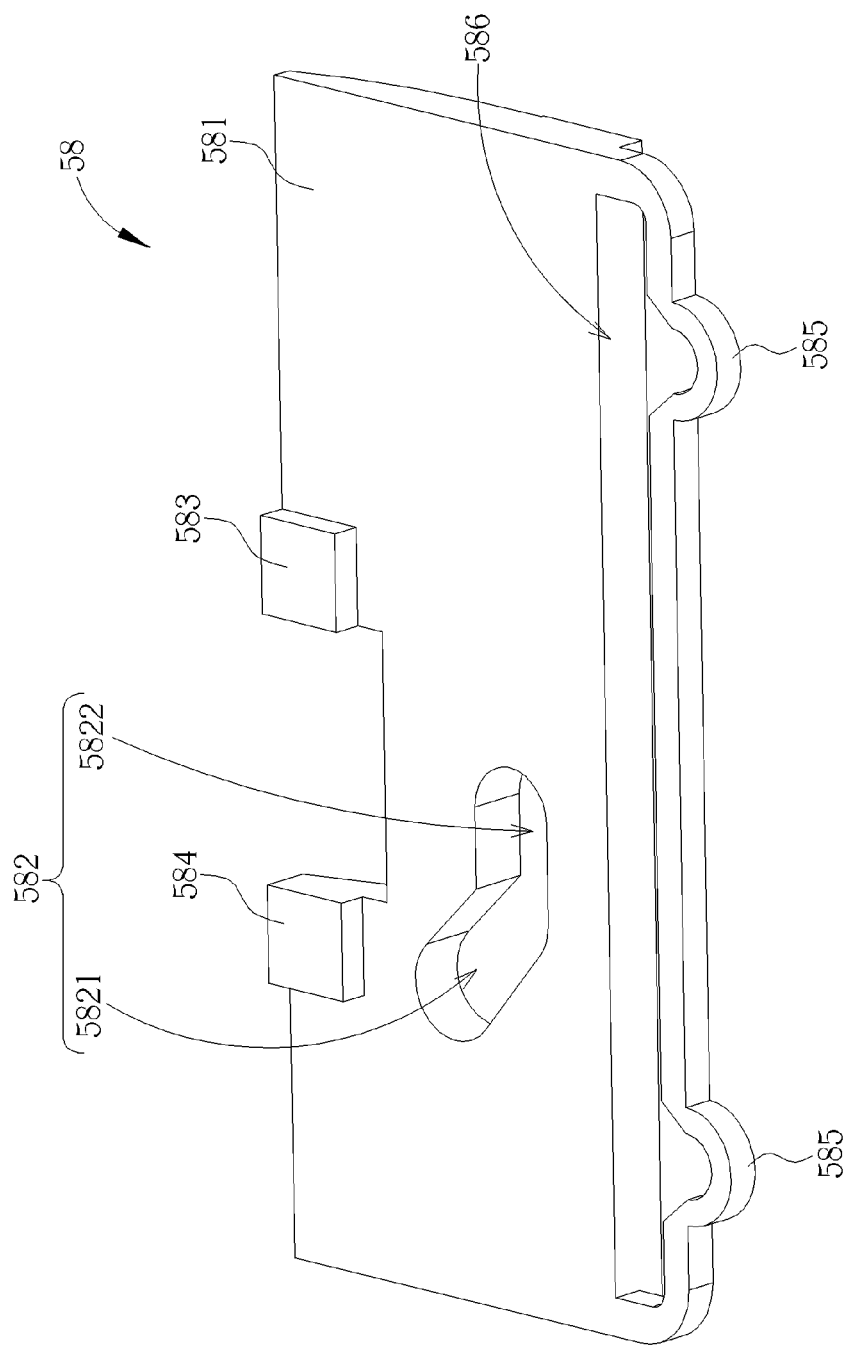
FIG. 4 is a diagram of a sliding key according to the embodiment of the present invention.

The fixing mechanism 50 further includes a sliding key 58 slidably installed on the base 54. Please refer to FIG. 1, FIG. 2 and FIG. 4. FIG. 4 is a diagram of the sliding key 58 according to the embodiment of the present invention. The sliding key 58 includes a key body 581 with a structure disposed on a side thereof. The structure is disposed through a hole 545 on the base 54 and exposed outside the base 54, such that the key body 581 can be pushed from an outer side of the base 54. A sliding slot 582 is formed on the key body 581, and the sliding slot 582 includes a first section 5821 and a second section 5822. The first section 5821 communicates with the second section 5822, and an angle is included between the first section 5821 and the second section 5822. The sliding key 58 further includes a driving part 583 disposed on the key body 581. When the key body 581 moves in a first direction, i.e. a +X direction, the driving part 583 pushes the second end 562 of the movable hook 56, so as to separate the first end 561 of the movable hook 56 from the accessory 52. In the meanwhile, the accessory 52 is detached. The sliding key 58 further includes a recovery part 584 disposed on the key body 581. The recovery part 584 is used for driving the second end 562 of the movable hook 56 to move in a direction opposite to the first direction, i.e. a −X direction, such that the movable hook 56 recovers to a position where the movable hook 56 engages with the accessory 52. In this embodiment, the driving part 583 and the recovery part 584 are disposed on two opposite sides of the second end 562 of the movable hook 56, and the driving part 583 and the recovery part 584 can be respectively a protruding structure. The recovery part 584 is used for pushing the second end 562 of the movable hook 56 to move in the direction opposite to the first direction, i.e. the −X direction. As known above, a movement direction of the movable hook 56 can be substantially parallel to a movement direction of the sliding key 58.

Furthermore, at least one first constraining structure 585 is formed on a side of the key body 581, and the fixing mechanism 50 further includes a constraining strip 60 disposed on the base 54. A plurality of second constraining structures 601 is formed on the constraining strip 60. When the key body 581 moves in the first direction, i.e. the +X direction, the at least one first constraining structure 585 is selectively fixed inside one of the plurality of second constraining structures 601. In this embodiment, there are two first constraining structures 585 formed on a side of the key body 581, and there are four second constraining structures 601 formed on the constraining strip 60. Furthermore, the single first constraining structure 585 corresponds to the two second constraining structures 601. Accordingly, there are two positions where the sliding key 58 can be fixed, that is, the sliding key 58 can be fixed in the two positions. Furthermore, each of the first constraining structures 585 and each of the second constraining structures 601 can be respectively an arc protrusion and an arc concave. In order to make the arc protrusions be more easily engaged with the corresponding arc concaves in a resiliently deformed manner, a breaking slot 586 can be formed on a side of the key body 581 whereon the first constraining structures 585 are formed, so as to reduce rigidity of the key body 581. Disposal positions and amounts of the first constraining structures 585 and the second constraining structures 601 are not limited in this embodiment, and it depends on practical demands.

Figure 5:
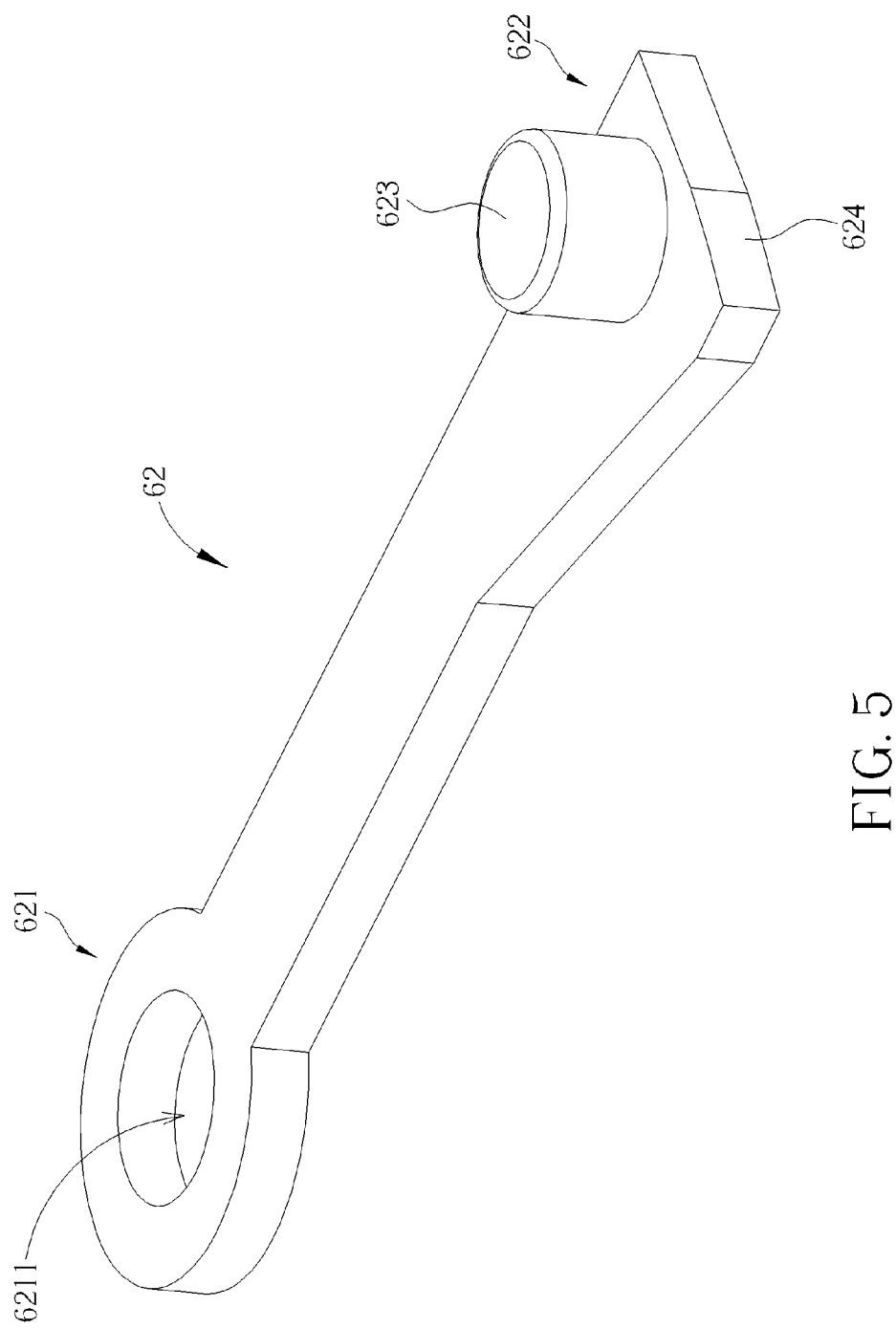
FIG. 5 is a diagram of a rotary arm according to the embodiment of the present invention.

The fixing mechanism 50 further includes a rotary arm 62. Please refer to FIG. 1, FIG. 2 and FIG. 5. FIG. 5 is a diagram of the rotary arm 62 according to the embodiment of the present invention. The rotary arm 62 includes a first end 621 and a second end 622. The first end 621 of the rotary arm 62 is rotatbly installed on the base 54, and the second end 622 of the rotary arm 62 is slidably installed inside the sliding slot 582 on the key body 581. For example, a round hole 6211 is formed on the first end 621 of the rotary arm 62, and the fixing mechanism 50 further includes a screwing component 64. The screwing component 64 is disposed through the round hole 6211 for screwing the first end 621 of the rotary arm 62 on a screw boss 547 on the base 54. In such a manner, a joint where the screwing component 64 screws the screw boss 547 is a rotational center of the rotary arm 62. In addition, the first end 621 of the rotary arm 62 can be installed on the base 54 in an engaging or a hot melting manner. As for which one of the above-mentioned designs is adopted, it depends on practical demands. Furthermore, a protruding post 623 is disposed on the second end 622 of the rotary arm 62 and installed inside the sliding slot 582. As a result, when the first end 621 of the rotary arm 62 rotates relative to the base 54, the second end 622 of the rotary arm 62 is capable of sliding along the sliding slot 582. In addition, a guiding structure 624 is further formed on the second end 622 of the rotary arm 62. When the rotary arm 62 is rotated, the guiding structure 624 is used for guiding the second end 622 of the rotary arm 62 to smoothly separate from the second end 562 of the movable hook 56.

In addition, the fixing mechanism 50 further includes a constraining part 66 disposed on the base 54 and installed inside the hole 5621 on the movable hook 56, so as to guide the movable hook 56 to move in the ±X direction, that is, to constrain that the movable hook 56 can only move in the ±X direction. The fixing mechanism 50 further includes at least one engaging part 68 disposed on the base 54. The engaging part 68 is used for engaging the key body 581 of the sliding key 58 on the base 54. For example, the engaging part 68 can be an engaging strip structure, and the fixing mechanism 50 can include two engaging parts 68 for engaging two ends of the engaging strip structure. Disposal position and an amount of the engaging part 68 are not limited to those mentioned in this embodiment, and it depends on practical demands. The fixing mechanism 50 can further include at least one stopping part 70 disposed on the base 54 and located on at least one side of the sliding key 58. The stopping part 70 is used for constraining sliding movement of the sliding key 58. For example, the stopping part 70 can be a stopping strip, and the fixing mechanism 50 can include two stopping parts 70 disposed on two sides of the sliding key 58. When the sliding key 58 slides in the ±X direction, the two stopping parts 70 are used for stopping the two sides of the key body 581, so as to constrain sliding movement of the sliding key 58. Disposal position and an amount of the stopping part 70 are not limited to those mentioned above, and it depends on practical demands.

Figure 6:
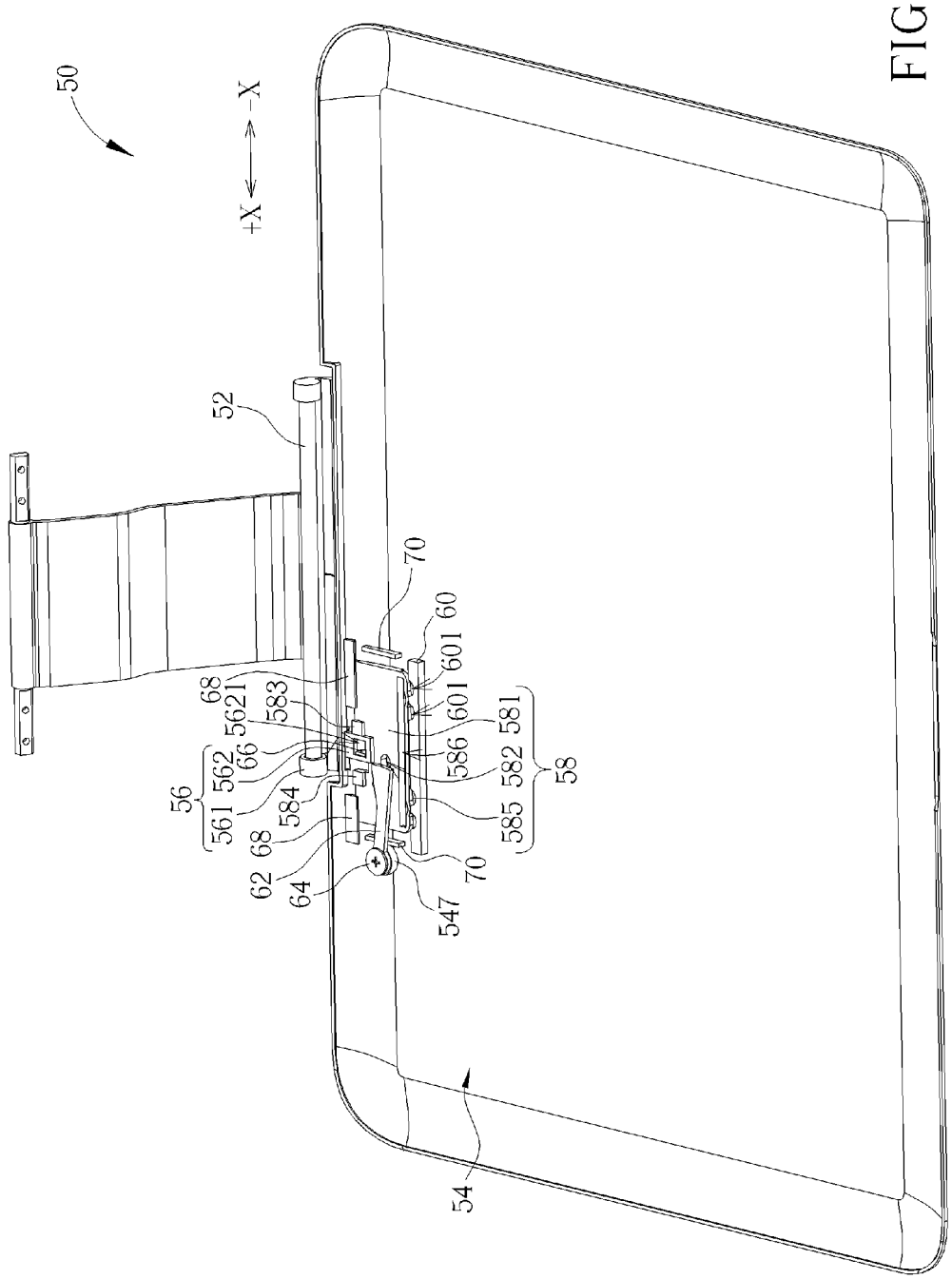
FIG. 6 and FIG. 7 are respectively diagrams of the fixing mechanism in different statuses according to the embodiment of the present invention.
Figure 7:
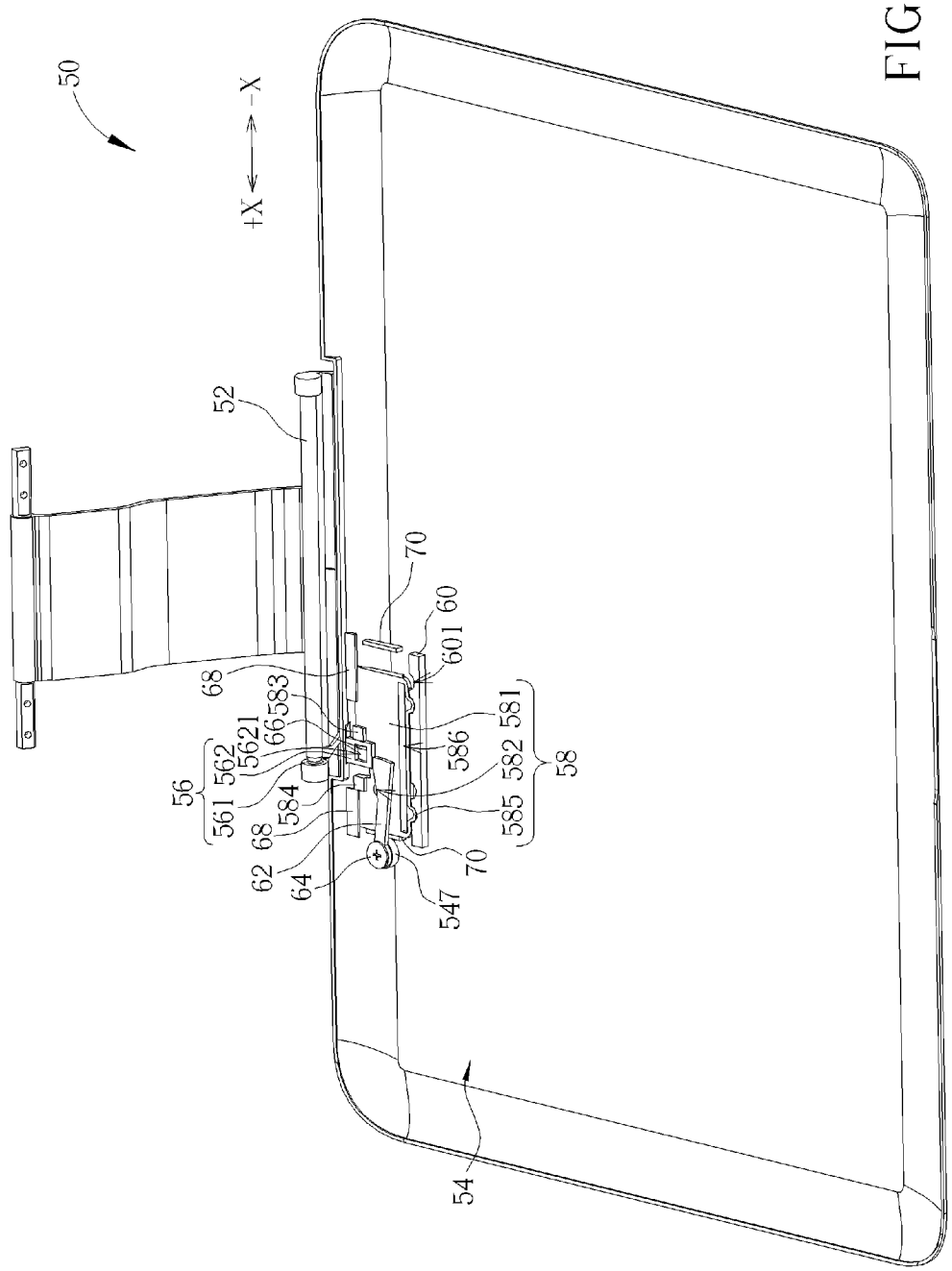

Please refer to FIG. 2, FIG. 5, FIG. 6 and FIG. 7. FIG. 2, FIG. 6 and FIG. 7 are respectively diagrams of the fixing mechanism 50 in different statuses according to the embodiment of the present invention. When the movable hook 56 is located in a position as shown in FIG. 2, the first end 561 of the movable hook 56 can hook the accessory 52, so as to fix the accessory 52 and prevent the accessory 52 from detaching from the base 54. In the meanwhile, the second end 622 of the rotary arm 62 is located in a closed position and stops the second end 562 of the movable hook 56, so as to prevent the movable hook 56 from moving in the first direction, i.e. the +X direction. Accordingly, it can ensure that the movable hook 56 does not separate from the accessory 52 and each of the first constraining structures 585 is fixed with the second constraining structures 601 on the right side. When the accessory 52 is desired to be detached, the sliding key 58 is pushed in the first direction, i.e. the +X direction. In the meanwhile, the second end 622 of the rotary arm 62 slides along the sliding slot 582 simultaneously, so as to gradually separate from the second end 562 of the movable hook 56. When the rotary arm 62 is rotated, the guiding structure 624 guides the second end 622 of the rotary arm 62 to smoothly separate from the second end 562 of the movable hook 56. As shown in FIG. 6, when the sliding key 58 is slid in the first direction, i.e. the +X direction, to a position where the driving part 583 contacts the second end 562 of the movable hook 56, the second end 622 of the rotary arm 62 has completely separated from the second end 562 of the movable hook 56. In the meanwhile, each of the first constraining structures 585 is compressed resiliently. Then, if the key body 581 of the sliding key 58 continues to move in the first direction, i.e. the +X direction, as shown in FIG. 7, the driving part 583 of the sliding key 58 is capable of pushing the second end 562 of the movable hook 56. Accordingly, the first end 561 of the movable hook 56 can separate from the accessory 52, and each of the first constraining structures 585 is fixed with one of the second constraining structures 601 on the left side. In the meanwhile, the accessory 52 is capable of being detached.

Please refer to FIG. 4 and FIG. 5. Since there is an angle formed between the first section 5821 of the sliding slot 582 and the second section 5822 of the sliding slot 582, an orientation of the first section 5821 is not parallel to the first direction, i.e. the +X direction, and an orientation of the second section 5822 can be substantially parallel to the first direction, i.e. the +X direction. When the key body 581 of the sliding key 58 moves in the first direction, i.e. the +X direction, the second end 622 of the rotary arm 62 slides inside the first section 5821, such that the rotary arm 62 rotates relative to the screwing component 64, i.e. relative to the first end 621. In the meanwhile, the second end 622 of the rotary arm 62 gradually separates from the second end 562 of the movable hook 56. When the second end 622 of the rotary arm 62 moves to a joint of the first section 5821 and the second section 5822, the driving part 583 can push the second end 562 of the movable hook 56. Afterwards, when the sliding key 58 continues to move in the first direction, i.e. the +X direction, the second end 622 of the rotary arm 62 slides from the first section 5821 to the second section 5822 without interfering with the second end 562 of the movable hook 56.

In addition, when the movable hook 56 is located in a position where the movable hook 56 separates from the accessory 52, as shown in FIG. 7, for recovering the movable hook 56 to the closed position, as shown in FIG. 2, the sliding key 58 can be pushed in the direction opposite to the first direction, i.e. the −X direction. In the meanwhile, the second end 622 of the rotary arm 62 slides inside the sliding slot 582. Similarly, when the second end 622 of the rotary arm 62 slides from the second section 5822 to the first section 5821, the second end 622 of the rotary arm 62 gradually approaches the second end 562 of the movable hook 56 and eventually stops the second end 562 of the movable hook 56. At the same time, the recovery part 584 of the sliding key 58 pushes the second end 562 of the movable hook 56 to move in the direction opposite to the first direction, i.e. the −X direction. Accordingly, when the second end 562 of the movable hook 56 moves to a position where the second end 562 of the movable hook 56 stops the driving part 583, the first end 621 of the rotary arm 62 is capable of engaging with the accessory 52, and the second end 622 of the rotary arm 62 recovers to the closed position along the sliding slot 582, as shown in FIG. 2.

Figure 8:
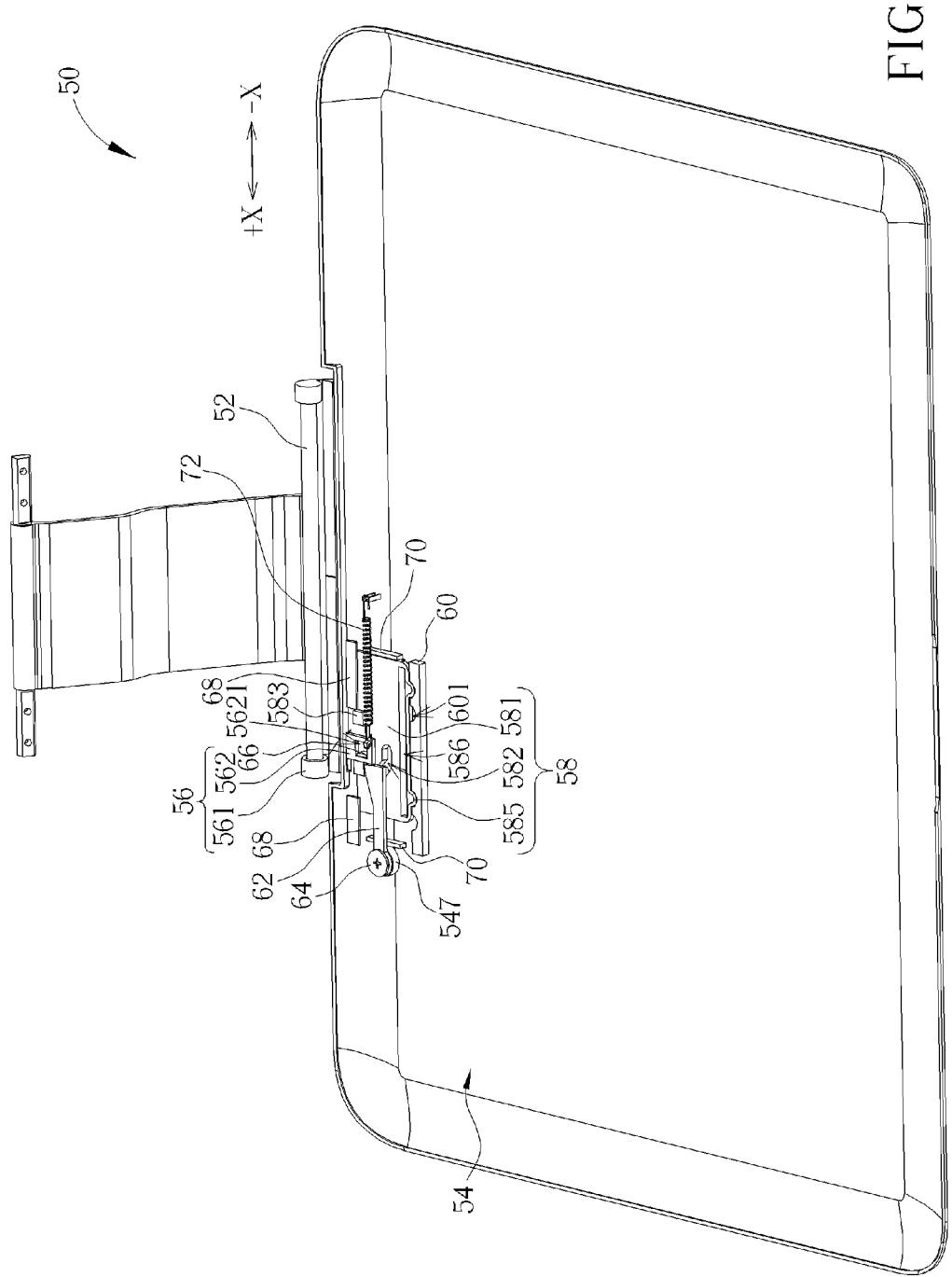
FIG. 8 is an assembly diagram of the fixing mechanism according to another embodiment of the present invention.

In addition, a design for the recovery part for recovering the movable hook 56 is not limited to that mentioned in this embodiment. For example, please refer to FIG. 8. FIG. 8 is an assembly diagram of the fixing mechanism 50 according to another embodiment of the present invention. The major difference between this embodiment and the aforesaid embodiment is that the fixing mechanism 50 further includes a recovery part 72 which replaces the recovery part 584 in the aforesaid embodiment for recovering the movable hook 56 to the position where the movable hook 56 is fixed with the accessory 52. In this embodiment, the driving part 583 and the recovery part 72 can be disposed on the same side relative to the second end 562 of the movable hook 56, and the recovery part 72 can be a spring. The recovery part 72 is used for pulling the second end 562 of the movable hook 56 to move in the direction opposite to the first direction, i.e. the −X direction. The components with the same denotes as those mentioned in the aforesaid embodiment have the same functiona and structures, and detailed descriptions are omitted herein for simplicity.

Compared to the prior art, the fixing mechanism of the present invention utilizes the mechanical design that a direction of fixing the accessory is identical to a direction of sliding the sliding key for not only providing a user with a good sense of operation, but also for preventing the accessory from easily separating from the portable electronic device. Furthermore, the fixing mechanism of the present invention has advantages of simple structure, fewer structural components and less-occupied mechanical space. Accordingly, the present invention provides the fixing mechanism for fixing the accessory with easy assembly, low cost and good structural strength.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing mechanism for fixing an accessory on a portable electronic device, the fixing mechanism comprising:
    a base whereon an opening is formed;
    a movable hook disposed through the opening in a slidable manner, a first end of the movable hook being for fixing the accessory;
    a sliding key slidably installed on the base, the sliding key comprising:
        a key body whereon a sliding slot is formed, at least a portion of the sliding slot being non-parallel to a first direction of the key body; and
        a driving part disposed on the key body for pushing a second end of the movable hook when the key body moves in the first direction, so as to separate the first end of the movable hook from the accessory; and
    a rotary arm with a first end rotatably installed on the base and a second end slidably installed inside the sliding slot on the key body, the second end of the rotary arm stopping the second end of the movable hook in a closed position for preventing the movable hook from moving in the first direction, the second end of the rotary arm sliding along the sliding slot as the key body moves in the first direction for separating from the second end of the movable hook, such that the driving part pushes the second end of the movable hook to move in the first direction.

2. The fixing mechanism of claim 1, wherein a hole is formed on the second end of the movable hook, and the fixing mechanism further comprises a constraining part disposed on the base and installed inside the hole, so as to guide the movable hook to move in the first direction.

3. The fixing mechanism of claim 1, wherein at least one first constraining structure is formed on a side of the key body, the fixing mechanism further comprises a constraining strip disposed on the base, a plurality of second constraining structures is formed on the constraining strip, and the at least one first constraining structure is selectively fixed inside one of the plurality of second constraining structures when the key body moves in the first direction.

4. The fixing mechanism of claim 3, wherein the first constraining structure and the second constraining structure are respectively an arc protrusion and an arc concave.

5. The fixing mechanism of claim 1, further comprising a recovery part disposed on the key body for driving the second end of the movable hook to move in a direction opposite to the first direction.

6. The fixing mechanism of claim 5, wherein the driving part and the recovery part are disposed on two opposite sides relative to the second end of the movable hook, and the recovery part is for pushing the second end of the movable hook to move in the direction opposite to the first direction.

7. The fixing mechanism of claim 6, wherein the driving part and the recovery part are respectively a protruding structure.

8. The fixing mechanism of claim 5, wherein the driving part and the recovery part are disposed on the same side relative to the second end of the movable hook, and the recovery part is for pulling the second end of the movable hook to move in the direction opposite to the first direction.

9. The fixing mechanism of claim 8, wherein the recovery part is a spring.

10. The fixing mechanism of claim 5, wherein the second end of the rotary arm slides along the sliding slot to the closed position when the recovery part drives the second end of the movable hook to move in the direction opposite to the first direction to a position where the second end of the movable hook stops the driving part.

11. The fixing mechanism of claim 1, wherein a protruding post is disposed on the second end of the rotary arm and installed inside the sliding slot.

12. The fixing mechanism of claim 1, wherein a guiding structure is formed on the second end of the rotary arm for guiding the second end of the rotary arm to separate from the second end of the movable hook when the rotary arm is rotated.

13. The fixing mechanism of claim 1, wherein the sliding slot comprises a first section and a second section, an angle is included between the first section and the second section, and the second end of the rotary arm slides from the first section to the second section when the key body moves in the first direction.

14. The fixing mechanism of claim 13, wherein an orientation of the first section is not parallel to the first direction, and an orientation of the second section is substantially parallel to the first direction.

15. The fixing mechanism of claim 1, further comprising at least one engaging part disposed on the base for engaging the key body on the base.

16. The fixing mechanism of claim 1, further comprising at least one stopping part disposed on the base and located on at least one side of the sliding key for constraining sliding movement of the sliding key.

17. The fixing mechanism of claim 1, wherein a round hole is formed on the first end of the rotary arm, the fixing mechanism further comprises a screwing component disposed through the round hole for screwing the first end of the rotary arm on the base.

18. The fixing mechanism of claim 1, wherein two inclined structures are respectively formed on the base and the movable hook for wedging each other and covering the opening on the base.

* * * * *